(12) United States Patent
Hanyu et al.

(10) Patent No.: US 8,992,740 B2
(45) Date of Patent: Mar. 31, 2015

(54) IBAD APPARATUS AND IBAD METHOD

(75) Inventors: Satoru Hanyu, Sakura (JP); Yasuhiro Iijima, Sakura (JP)

(73) Assignee: Fujikura Ltd., Tokyo (JP)

( * ) Notice: Subject to any disclaimer, the term of this patent is extended or adjusted under 35 U.S.C. 154(b) by 291 days.

(21) Appl. No.: 13/440,509

(22) Filed: Apr. 5, 2012

(65) Prior Publication Data

US 2012/0228130 A1 Sep. 13, 2012

Related U.S. Application Data

(63) Continuation-in-part of application No. PCT/JP2010/067621, filed on Oct. 7, 2010.

(30) Foreign Application Priority Data

Oct. 8, 2009 (JP) ................................. 2009-234352

(51) Int. Cl.
| | | |
|---|---|---|
| *C23C 14/34* | (2006.01) | |
| *C23C 14/08* | (2006.01) | |
| *C23C 14/46* | (2006.01) | |
| *C23C 14/56* | (2006.01) | |
| *C30B 23/02* | (2006.01) | |
| *C30B 29/22* | (2006.01) | |

(52) U.S. Cl.
CPC ................. *C23C 14/08* (2013.01); *C23C 14/46* (2013.01); *C23C 14/562* (2013.01); *C30B 23/02* (2013.01); *C30B 29/22* (2013.01)
USPC ............ 204/192.11; 204/298.04; 204/298.24; 204/192.24

(58) Field of Classification Search
USPC .................. 118/723 FI; 204/192.11, 298.04, 204/298.24; 216/66, 94; 438/712, 961
See application file for complete search history.

(56) References Cited

U.S. PATENT DOCUMENTS

| | | | | |
|---|---|---|---|---|
| 3,409,529 A | * | 11/1968 | Chopra et al. | ............ 204/192.11 |
| 4,424,103 A | * | 1/1984 | Cole | ......................... 204/192.11 |
| 5,089,104 A | | 2/1992 | Kanda et al. | |

(Continued)

FOREIGN PATENT DOCUMENTS

| | | |
|---|---|---|
| JP | 03-173770 A | 7/1991 |
| JP | 06-145977 A | 5/1994 |

(Continued)

OTHER PUBLICATIONS

Translation to Machida (JP 2004-285424) dated Apr. 5, 2012.*

(Continued)

*Primary Examiner* — John Brayton
(74) *Attorney, Agent, or Firm* — Sughrue Mion, PLLC

(57) ABSTRACT

An IBAD apparatus includes, a target, a sputter ion source irradiating the target with sputter ions to sputter some of constituent particles of the target, a film formation region in which a base material for depositing thereon the particles sputtered from the target is disposed, and an assist ion beam irradiation device irradiating assist ion beams from a direction oblique to the direction of a normal of the film formation surface of the base material disposed in the film formation region, where the sputter ion source includes a plurality of ion guns arranged so as to be able to irradiate the target from an end portion on one side to an end portion on the other side with sputter ion beams, and current values for generating the sputter ion beams of the plurality of ion guns are set respectively.

7 Claims, 5 Drawing Sheets

(56) References Cited

U.S. PATENT DOCUMENTS

| | | | |
|---|---|---|---|
| 6,906,008 B2* | 6/2005 | Selvamanickam et al. | 505/434 |
| 2002/0197509 A1* | 12/2002 | Carcia et al. | 428/689 |
| 2004/0168636 A1* | 9/2004 | Savvides et al. | 118/723 CB |

FOREIGN PATENT DOCUMENTS

| | | |
|---|---|---|
| JP | 08-074052 A | 3/1996 |
| JP | 2004-027306 A | 1/2004 |
| JP | 2004-071359 A | 3/2004 |
| JP | 2004-285424 A | 10/2004 |

OTHER PUBLICATIONS

Tape. (n.d.) The American Heritage® Dictionary of the English Language, Fourth Edition. (2003). Retrieved Jul. 22, 2013 from http://www.thefreedictionary.com/tape.*

Longitudinal. (n.d.) The American Heritage® Dictionary of the English Language, Fourth Edition. (2003). Retrieved Jul. 22, 2013 from http://www.thefreedictionary.com/longitudinal.*

* cited by examiner

IBAD APPARATUS AND IBAD METHOD

CROSS REFERENCE TO RELATED APPLICATIONS

This application is a continuation application based on a PCT Patent Application No. PCT/JP2010/067621, filed Oct. 7, 2010, whose priority is claimed on Japanese Patent Application No. 2009-234352 filed Oct. 8, 2009, the entire content of which are hereby incorporated by reference.

BACKGROUND OF THE INVENTION

1. Field of the Invention

The present invention relates to an IBAD apparatus and an IBAD method, both of which are used for the manufacturing of a base material for oxide superconducting conductors.

2. Description of the Related Art

Since an RE-123-based oxide superconducting conductor ($REBa_2Cu_3O_{7-x}$: RE is any one of rare-earth elements including Y) exhibits excellent superconductivity at liquid nitrogen temperature or more, it is regarded as a very promising material for practical use and it is strongly desired to use the RE-123-based oxide superconducting conductor as a conductor for electric power supply by processing it into a wire. As a conductor which is used for such an RE-123-based oxide superconducting conductor, as shown in FIG. 7, a structure formed by laminating an intermediate layer 102 formed by an IBAD (Ion Beam Assisted Deposition) method, a cap layer 103, and an oxide superconducting layer 104 in this order on a tape-shaped metal base material 101 is known (refer to the following Japanese Unexamined Patent Application, First Publication No. 2004-71359, for example).

In the oxide superconducting conductor, the intermediate layer 102 and the cap layer 103 are provided to control the crystalline orientation of the oxide superconducting layer 104. That is, an oxide superconductor has electric anisotropy in which electricity easily flows in an a-axis direction and a b-axis direction of the crystal axes thereof, but electricity does not easily flow in a c-axis direction. Therefore, in a case where a conductor is constituted using the oxide superconductor, the oxide superconducting layer 104 requires that an a-axis or a b-axis be oriented in the direction of flowing electricity and a c-axis be oriented in the other direction.

Here, as a technique of forming the intermediate layer 102 which is used for this type of oxide superconducting conductor, the IBAD method is widely known. An intermediate layer which is formed by the IBAD method is constituted by a material in which a physical characteristic value such as coefficient of thermal expansion or lattice constant shows an intermediate value between the metal base material 101 and the oxide superconducting layer 104, for example, MgO, YSZ (yttria-stabilized zirconium), $SrTiO_3$, or the like. Such an intermediate layer 102 serves as a buffer layer which reduces a difference in physical characteristics between the metal base material 101 and the oxide superconducting layer 104. Further, by forming the intermediate layer 102 by the IBAD method, the crystal of the intermediate layer 102 has a high degree of in-plane orientation and the intermediate layer 102 serves as an orientation control film which controls the orientation of the cap layer 103. An orientation mechanism of the intermediate layer 102 which is formed by the IBAD method will be described below.

As shown in FIG. 8, an apparatus for forming an intermediate layer by the IBAD method has a traveling system for making the metal base material 101 travel in the longitudinal direction thereof, a target 201, the surface of which obliquely confronts the surface of the metal base material 101, a sputter beam irradiation device 202 which irradiates the target 201 with ions, and an ion source 203 which irradiates the surface of the metal base material 101 with ions (mixed ions of rare gas ions and oxygen ions) from an oblique direction. These respective sections are disposed in a vacuum container (not shown).

In order to form the intermediate layer 102 on the metal base material 101 by this intermediate layer forming apparatus, the inside of the vacuum container is set to be in a reduced-pressure atmosphere and the sputter beam irradiation device 202 and the ion source 203 are then operated. In this way, ions are irradiated from the sputter beam irradiation device 202 to the target 201, so that constituent particles of the target 201 are splashed and deposited on the metal base material 101. At the same time, the mixed ions of rare gas ions and oxygen ions are radiated from the ion source 203, thereby being incident on the surface of the metal base material 101 at a given incidence angle ($\theta$).

In this manner, by performing ion irradiation at a given incidence angle while depositing the constituent particles of the target 201 on the surface of the metal base material 101, a specific crystal axis of a sputtered film being formed is fixed in the incident direction of the ions. As a result, the c-axis is oriented in the vertical direction with respect to the surface of the metal base material and also the a-axis and the b-axis are oriented in given directions in a plane. For this reason, the intermediate layer 102 formed by the IBAD method has a high degree of in-plane orientation.

On the other hand, the cap layer 103 is constituted by a material, for example, $CeO_2$, which epitaxially grows by being formed on the surface of the intermediate layer 102 with the in-plane crystal axes oriented in this manner, and thereafter, performs grain-growth in a lateral direction, so that crystal grains can be self-oriented in an in-plane direction. The cap layer 103 is self-oriented in this manner, thereby being able to obtain a higher degree of in-plane orientation than that of the intermediate layer 102. Therefore, if the oxide superconducting layer 104 is formed on the metal base material 101 with the intermediate layer 102 and the cap layer 103 interposed therebetween, the oxide superconducting layer 104 epitaxially grows so as to conform to the crystalline orientation of the cap layer 103 having a high degree of in-plane orientation. For this reason, it is possible to obtain the oxide superconducting layer 104 having excellent in-plane orientation and large critical current density.

FIG. 9 shows a schematic structure example of a specific apparatus in the case of carrying out the above-described IBAD method. The configuration of an IBAD apparatus 300 of this example will be described below. A long tape-shaped base material 301 is wound a plurality of times round a first roll 302 and a second roll 303 to travel back and forth. A rectangular target 305 is disposed so as to face the base material 301 which is exposed in a plurality of rows between the first roll 302 and the second roll 303. A sputter ion source origin 306 is disposed so as to face the target 305 in an oblique direction. An assist ion source origin 307 is disposed so as to face the base material 301 which is exposed in a plurality of rows between the first roll 302 and the second roll 303, from an oblique direction with a given angle (for example, 45° or 55° with respect to a normal of the film formation surface of the base material 301).

In addition, as another ion beam sputtering apparatus, as described in the following Japanese Unexamined Patent Application, First Publication No. 2004-027306, an apparatus is known which adopts a configuration in which a plurality of ion guns is provided so as to correspond to a plurality of targets, and has a configuration in which two sets of ion guns are disposed at the symmetric positions of a rotating holder provided with the targets. Further, an apparatus having a configuration in which a plurality of ion guns is provided is also known. Further, as described in the following Japanese Unexamined Patent Application, First Publication No. 8-74052, an ion beam sputtering apparatus is known in which a plurality of ion guns is provided with respect to a single target. Further, as described in the following Japanese Unexamined Patent Application, First Publication No. 2004-285424, an ion beam sputtering apparatus is known in which a plurality of ion gun drives is provided to irradiate a plurality of areas of a target with ion beams and current density distribution is controlled for each ion beam irradiation position.

The IBAD apparatus 300 shown in FIG. 9 is advantageous when trying to form a thick film and has a feature that enables productivity to be improved, because the base material 301 travels back and forth a plurality of times between the first roll 302 and the second roll 303. However, in the IBAD apparatus 300 shown in FIG. 9, in order to make sputter particles uniformly reach a plurality of rows of base materials 301 which are spanned across the first roll 302 and the second roll 303, the sputtering target 305 is made to have a large rectangular shape. In response to this, the sputter ion source origin 306 is also made to have a rectangular shape. Since such a large rectangular ion source origin 306 is not commonly used in a general film-formation field such as a semiconductor field, but a special order product, it has the problem that it is inevitably very expensive.

Further, in the large IBAD apparatus 300 as shown in FIG. 9, in order to maintain uniformity of a film thickness and film quality, it is necessary to balance the intensities of the assist ion beam and the sputter ion beam. In this type of ion beam sputtering apparatus, usually, one set of assist ion gun and one set of the sputter ion gun are present. However, in a case where an ion source of a sputter beam is one, it is extremely difficult to further adjust a film thickness while forming a film on a large area.

The present invention has an object to provide an IBAD apparatus and an IBAD method, both of which are suitable for the manufacturing of a base material for an oxide superconducting conductor having an intermediate layer having excellent crystalline orientation and a uniform film thickness, which is a base material having an intermediate layer that becomes a basis for forming an oxide superconducting layer having excellent crystalline orientation.

SUMMARY

In order to solve the above-described problems, the present invention adopts the following configurations.

According to an aspect of the invention, there is provided an IBAD apparatus including, a target, a sputter ion source irradiating the target with sputter ions to sputter some of constituent particles of the target, a film formation region in which a base material for depositing thereon the particles sputtered from the target is disposed, and an assist ion beam irradiation device irradiating assist ion beams from a direction oblique to the direction of a normal of the film formation surface of the base material disposed in the film formation region, where the sputter ion source includes a plurality of ion guns arranged so as to be able to irradiate the target from an end portion on one side to an end portion on the other side with sputter ion beams, and current values for generating the sputter ion beams of the plurality of ion guns are set respectively.

The current value of each of the ion guns disposed at both ends of the plurality of ion guns may be set to be higher than the current value of each of other ion guns disposed between the ion guns disposed at both ends.

The target may be formed in a rectangular shape so as to correspond to the film formation region, and the plurality of ion guns may be disposed along the longitudinal direction of the target.

The current value of each of the ion guns disposed at both ends may be set to be 4 to 100% higher than the current value of each of the other ion guns disposed between the ion guns disposed at both ends.

The current values of the plurality of ion guns may be respectively adjusted.

According to another aspect of the invention, there is provided an IBAD method for forming a film on the base material disposed in the film formation region by depositing the constituent particles of the target on the base material by using an IBAD apparatus including, a target, a sputter ion source including a plurality of ion guns arranged so as to be able to irradiate the target from an end portion on one side to an end portion on the other side with sputter ion beams which sputter some of constituent particles of the target, a film formation region in which a base material for depositing thereon the particles sputtered from the target is disposed, and an assist ion beam irradiation device irradiating of assist ion beams from a direction oblique to the direction of a normal of the film formation surface of the base material disposed in the film formation region, and forms a film on the base material disposed in the film formation region by depositing the constituent particles of the target on the base material, the method including, performing ion beam assisted deposition with the current value for generating the sputter ion beam of each of the ion guns disposed at both ends of the plurality of ion guns set to be higher than the current value for generating the sputter ion beam of each of other ion guns disposed between the ion guns disposed at both ends.

When performing ion beam assisted deposition, the current value of each of the ion guns disposed at both ends may be set to be 4 to 100% higher than the current value of each of other ion guns disposed between the ion guns disposed at both ends.

According to the IBAD apparatus and the IBAD method related to the above-described aspects of the invention, among the ion guns arranged so as to correspond to the target, the ion gun that irradiates an end portion on one side of the target with the sputter beams and the ion gun that irradiates an end portion on the other side of the target with the sputter beams have current values for ion beam generation set to be higher than those of other ion guns which are disposed between the above-described ion guns. For this reason, in a case where a film having excellent crystalline orientation is formed on a base material by the IBAD method, it is possible to efficiently and uniformly perform generation of sputter particles from every corner of a target. As a result, it is possible to form an intermediate layer which is excellent in crystalline orientation and small in variation in film thickness, on a base material. For this reason, even in a case where a large-area oxide superconducting layer is formed on a base material, it is possible to obtain an oxide superconducting layer which is excellent in crystalline orientation and small in variation in film thickness.

Further, in a rectangular ion gun in the related art, adjustment as described above for each position cannot be performed, whereas in the IBAD apparatus according to one aspect of the invention, even in a film formation process for a large area using a large-area target for sputtering, it is possible to provide an apparatus for obtaining a film having excellent orientation while securing film thickness uniformity, at low cost, so that the manufacturing cost of an oxide superconducting conductor can be reduced.

Further, by setting a current value which is applied to an ion gun corresponding to the end portion side of the target to be 4 to 100% higher than a current value which is applied to an ion gun corresponding to the central side of the target, it is possible to improve the uniformity of sputter particles which are sputtered from the target, thereby forming a film having a uniform thickness.

DETAILED DESCRIPTION OF THE PREFERRED EMBODIMENTS

An embodiment of the invention will be described below.

Base Material for Oxide Superconducting Conductor and Oxide
Superconducting Conductor First, a base material for an oxide superconducting conductor which is manufactured by an IBAD apparatus and an IBAD method according to an embodiment of the invention and an oxide superconducting conductor with the base material for an oxide superconducting conductor applied thereto will be described below.

Figure 1:
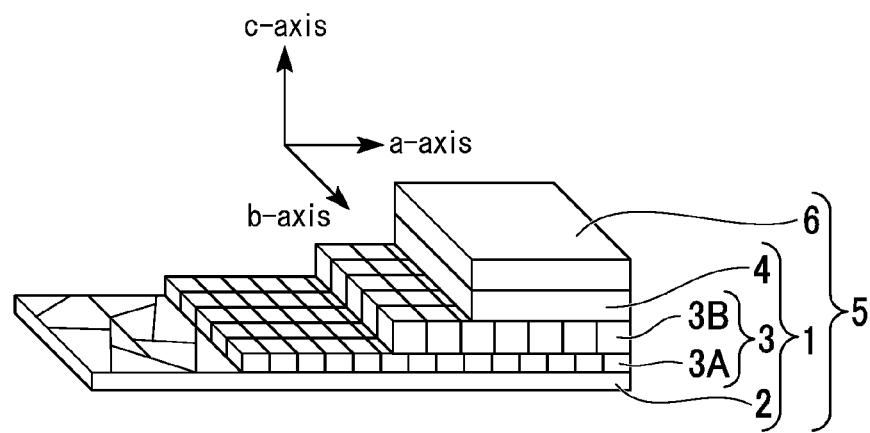
FIG. 1 is a schematic configuration diagram showing the structures of a base material for an oxide superconducting conductor and an oxide superconducting conductor according to an embodiment of the invention.

FIG. 1 is a schematic cross-sectional view in a longitudinal direction showing the structures of the base material for an oxide superconducting conductor which is manufactured by the IBAD method according to an embodiment of the invention and the oxide superconducting conductor with the base material for an oxide superconducting conductor applied thereto. As shown in FIG. 1, a base material for an oxide superconducting conductor 1 according to the present embodiment has a laminated structure which includes an intermediate layer 3 formed on a metal base material 2 by the IBAD method, and a cap layer 4 formed on the intermediate layer 3, and an oxide superconducting conductor 5 has a basic structure in which an oxide superconducting layer 6 is formed on the cap layer 4 of the base material for the oxide superconducting conductor 1 described above. In addition, it is also possible to easily apply the invention to a structure in which a diffusion prevention layer, a foundation layer, or the like is first formed on the metal base material 2 and the intermediate layer 3 is then formed thereon. It is also possible to apply the invention to a structure in which a stabilizing layer is easily laminated on the oxide superconducting layer 6. Hereinafter, a material constituting each layer described above will be described in detail.

Metal Base Material

As a material constituting the metal base material 2, metal such as Cu, Ni, Ti, Mo, Nb, Ta, W, Mn, Fe, or Ag, which is superior in strength and heat resistance, or its alloy can be used. Particularly preferable is stainless steel, hastelloy, or other nickel-based alloys, which are superior in terms of corrosion resistance and heat resistance. Alternatively, in addition to these, a ceramic base material, amorphous alloy base material, or the like may also be used.

Intermediate Layer

The intermediate layer 3 is a vapor-deposited film formed by an IBAD method and functions as a buffer layer which reduces a difference in physical characteristics (coefficient of thermal expansion, lattice constant, or the like) between the metal base material 2 and the oxide superconducting layer 6, and also functions as an orientation control film that controls the orientation of the cap layer 4 which is formed thereon. In the case of forming the intermediate layer 3, the IBAD method is carried out by using the IBAD apparatus according to the invention. However, explanation thereof will be described later.

As a material constituting the intermediate layer 3, a material is used in which a physical characteristic shows an intermediate value between the metal base material 2 and the oxide superconducting layer 6. As such a material of the intermediate layer 3, for example, yttria-stabilized zirconium (YSZ), MgO, $SrTiO_3$, $Gd_2Zr_2O_7$, or the like can be mentioned. In addition, it is possible to use an appropriate compound having a pyrochlore structure, a rare earth-C structure, a perovskite-type structure, a fluorite-type structure, or a rock salt structure. Among them, as a material of the intermediate layer 3, it is preferable to use YSZ, $Gd_2Zr_2O_7$, or MgO. Since $Gd_2Zr_2O_7$ or MgO can particularly reduce the value of $\Delta\Phi$ (FWHM: full width at half maximum), which is an index representing the degree of orientation in the IBAD method, it is particularly suitable as a material of the intermediate layer.

The film thickness of the intermediate layer 3 is preferably in a range of 5 nm to 2000 nm, for example, and more preferably in a range of 50 nm to 1000 nm. However, it is not limited only to these ranges.

If the film thickness of the intermediate layer 3 exceeds 1000 nm, since a film formation speed of the IBAD method which is used as a film formation method of the intermediate layer 3 is relatively low, the film formation time of the intermediate layer 3 increases. If the film thickness of the intermediate layer 3 exceeds 2000 nm, the surface roughness of the intermediate layer 3 increases, so that there is a possibility that the critical current density of the oxide superconducting conductor 5 may decrease.

On the other hand, if the film thickness of the intermediate layer 3 is less than 5 nm, it is difficult to control the crystalline orientation of the intermediate layer itself, so that control of the degree of orientation of the cap layer 4 which is formed thereon becomes difficult and control of the degree of orientation of the oxide superconducting layer 6 which is formed on the cap layer 4 also becomes difficult. As a result, there is a possibility that the critical current of the oxide superconducting conductor 5 may become insufficient.

The intermediate layer 3 in the present embodiment need not be a one-layer structure, and for example, in the example shown in FIG. 1, the intermediate layer 3 has a two-layer structure which is composed of a first layer 3A made of MgO on the base material 2 side and a second layer 3B made of $Gd_2Zr_2O_7$ laminated on the first layer 3A. However, other multilayered structures are also acceptable.

Cap Layer

The cap layer 4 has a function to control the orientation of the oxide superconducting layer 6 which is provided thereon, and also has a function to suppress the diffusion of an element constituting the oxide superconducting layer 6 to the intermediate layer 3 or the reaction of the intermediate layer 3 with gas which is used at the time of film formation, or the like.

As the cap layer 4, a layer is preferable that is formed through a process in which it epitaxially grows with respect to the surface of the intermediate layer 3 and then performs grain-growth (overgrowth) in a lateral direction (a plane direction), whereby crystal grains selectively grow in an in-plane direction. In the cap layer 4 selectively grown in this manner, a degree of in-plane orientation higher than that of the intermediate layer 3 can be obtained.

As a material constituting the cap layer 4, provided that it is a material capable of expressing such a function, it is not particularly limited. However, for example, it is preferable to use $CeO_2$, $Y_2O_3$, or the like.

In the case of using $CeO_2$ as a constituent material of the cap layer 4, the cap layer 4 need not be entirely constituted by $CeO_2$ and may also include a Ce-M-O-based oxide in which some of Ce is substituted by other metal atoms or metal ions.

The appropriate film thickness of the cap layer 4 differs depending on the constituent material of the cap layer 4. For example, in a case where the cap layer 4 is constituted by $CeO_2$, the film thickness of the cap layer 4 is preferably in a range of 50 nm to 5000 nm and more preferably in a range of 100 nm to 5000 nm. If the film thickness of the cap layer 4 deviates from these ranges, there is a case where a sufficient degree of orientation cannot be obtained.

Oxide Superconducting Layer

As a material of the oxide superconducting layer 6, an RE-123-based oxide superconductor ($REBa_2Cu_3O_{7-x}$: RE is a rare-earth element such as Y, La, Nd, Sm, Eu, or Gd) can be used. Preferable as an RE-123-based oxide is Y123 ($YBa_2Cu_3O_{7-x}$), Gd123 ($GdBa_2Cu_3O_{7-x}$), or the like.

Method of Manufacturing Base Material for Oxide Superconducting Conductor and Oxide Superconducting Conductor Next, a method of manufacturing the base material for an oxide superconducting conductor having the above-described structure will be described.

First, a long metal base material 2 of a tape shape or the like, which is made of the above-described material, is prepared, and the intermediate layer 3 made of the above-described material is then formed on the metal base material 2 by the IBAD method. Further, the cap layer 4 is formed on the intermediate layer 3 by a reactive DC sputtering method or the like using a metal target.

In the explanation of the present embodiment, a case where the intermediate layer 3 is formed by the IBAD method using the IBAD apparatus will be described below.

IBAD Apparatus

Figure 2:
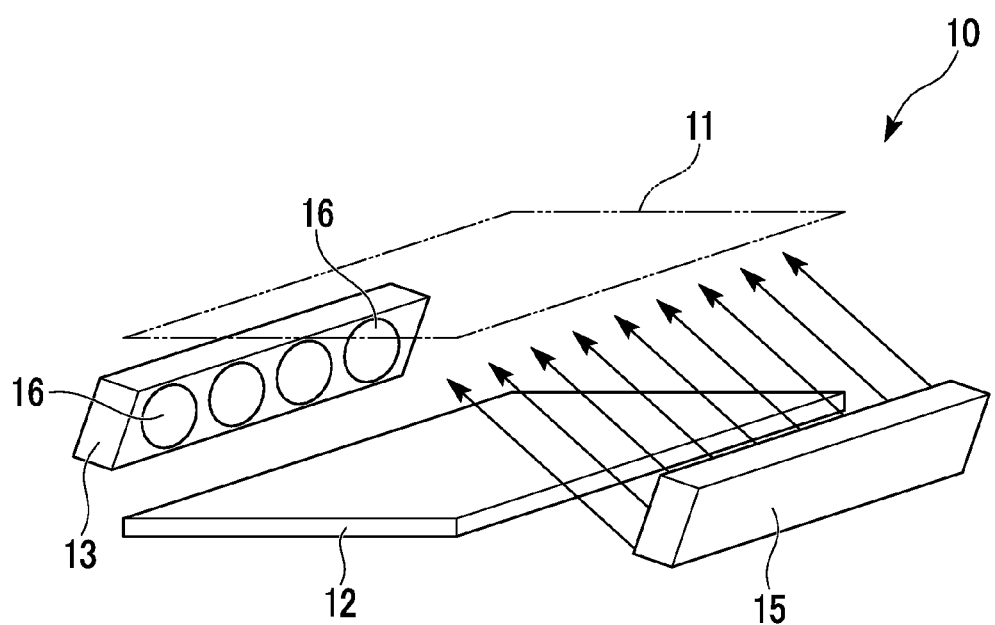
FIG. 2 is a schematic configuration diagram showing an IBAD apparatus according to a first embodiment of the invention.

FIG. 2 is a schematic configuration diagram showing an IBAD apparatus according to a first embodiment of the invention.

An IBAD apparatus 10 shown in FIG. 2 is configured such that a rectangular target 12 is disposed so as to face an approximately rectangular film formation region 11 in which a tape-shaped base material or the like is disposed, a sputter ion source origin 13 is disposed so as to face in a direction oblique to the target 12, and an assist ion source origin 15 is disposed so as to face in an oblique direction at a given angle (for example, 45°, 55°, or the like) with respect to a normal of the film formation region 11.

Figure 5:
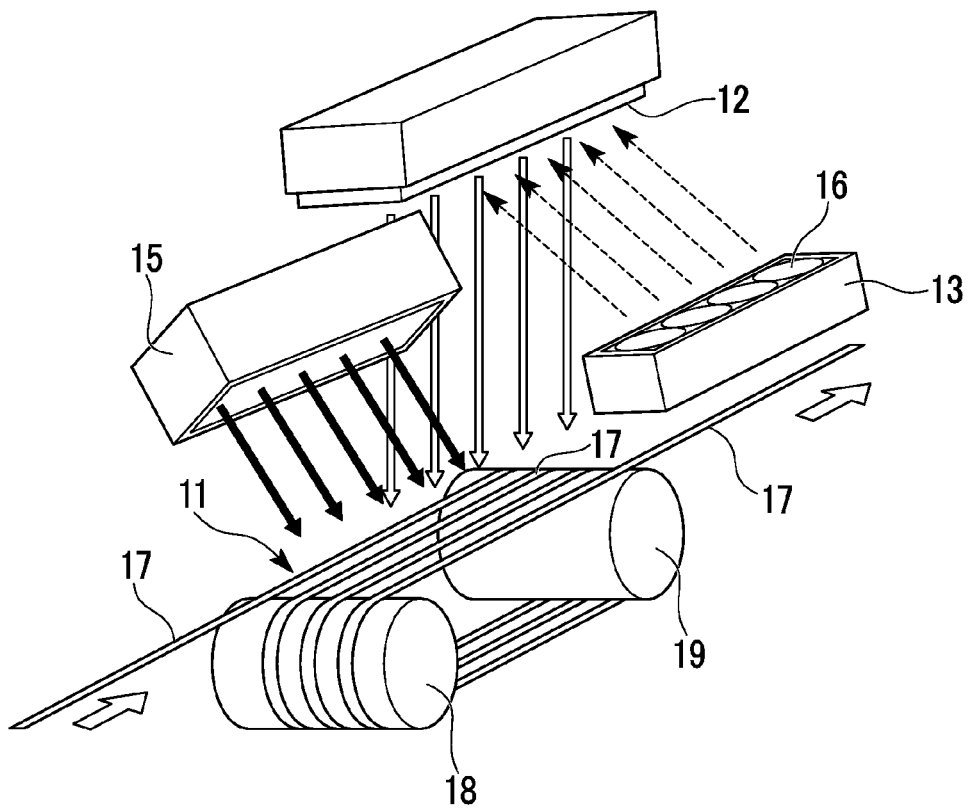
FIG. 5 is a schematic configuration diagram showing an application example of the IBAD apparatus shown in FIG. 2.

The IBAD apparatus 10 in the present example is a film formation apparatus which is provided in a form in which it is accommodated in a vacuum chamber. As the film formation region 11 of the apparatus, specifically, for example, as shown in FIG. 5, a structure can be exemplified in which a tape-shaped base material 17 is wound a plurality of times back and forth round first and second rolls 18 and 19 disposed to face each other, thereby traveling back and forth in the film formation region 11, or the like. However, it is not limited only to the apparatus structure shown in FIG. 5. In addition, in FIG. 5, an up-and-down positional relationship of the target 12 and the film formation region 11 is reversed with respect to the configuration shown in FIG. 2. However, the up-and-down relationship thereof may be arbitrary. The whole apparatus is configured by adjusting the up-and-down positional relationship of the sputter ion source origin 13 and the assist ion source origin 15 in such a manner that the sputter ion source origin 13 faces the target 12 and the assist ion source origin 15 faces the film formation region 11, in accordance with the up-and-down positional relationship of the target 12 and the film formation region 11.

The vacuum chamber which is used in the present embodiment is a container separating a film formation space from the outside and has airtightness and also has pressure resistance because the inside enters into a high vacuum state. Gas supply means for introducing carrier gas and reaction gas into the vacuum chamber and exhaust means for exhausting gas in the vacuum chamber are connected to the vacuum chamber. In FIG. 2, the gas supply means and the exhaust means are omitted and only a disposition relationship of each device is shown.

The target 12 which is used here can be set to be a target having a composition suitable for the case of forming the intermediate layer 3 made of the above-described material.

Figure 4:
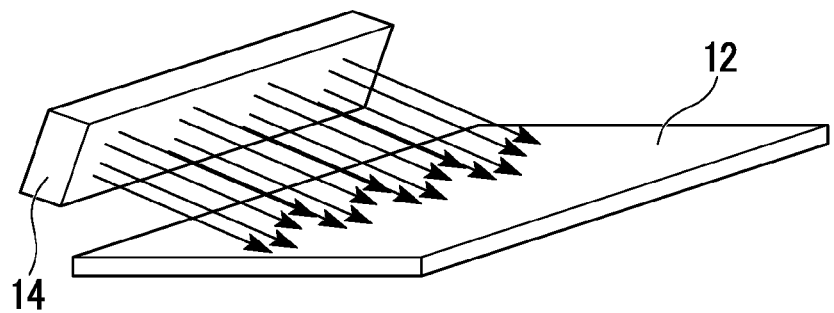
FIG. 4 is a schematic configuration diagram showing an ion gun of an IBAD apparatus in the related art.

In an apparatus in the related art, as shown in FIG. 4, a rectangular sputter ion source origin 14 is used, whereas the sputter ion source origin 13 which is used in the present embodiment has a structure in which four round ion guns 16 are disposed laterally in a row.

Figure 6:
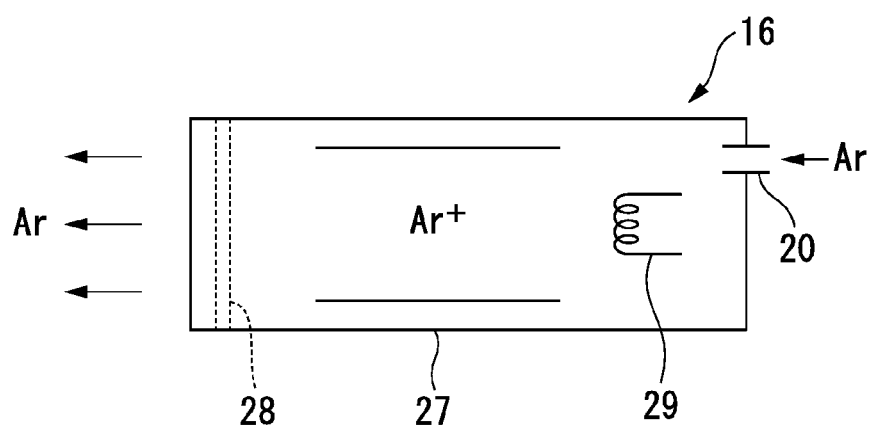
FIG. 6 is a schematic configuration diagram showing the structure of an ion gun which is applied to an IBAD apparatus according to an embodiment of the invention.
Figure 7:
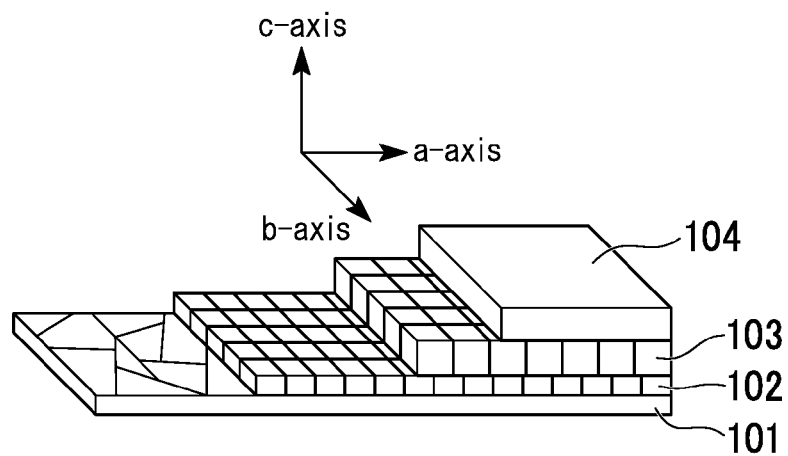
FIG. 7 is a schematic configuration diagram showing one example of the structures of a base material for an oxide superconducting conductor and an oxide superconducting conductor which is manufactured by an IBAD apparatus in the related art and an IBAD method in the related art.
Figure 8:
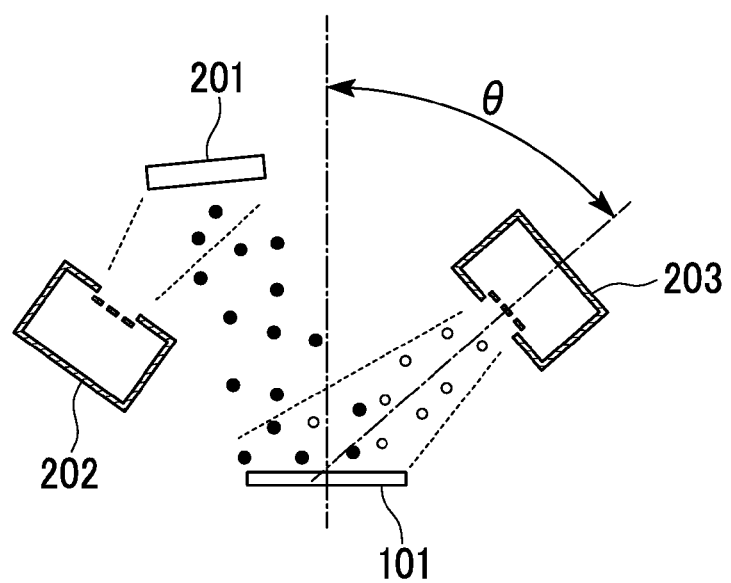
FIG. 8 is a schematic configuration diagram showing one example of an intermediate layer forming apparatus using for an IBAD method.
Figure 9:
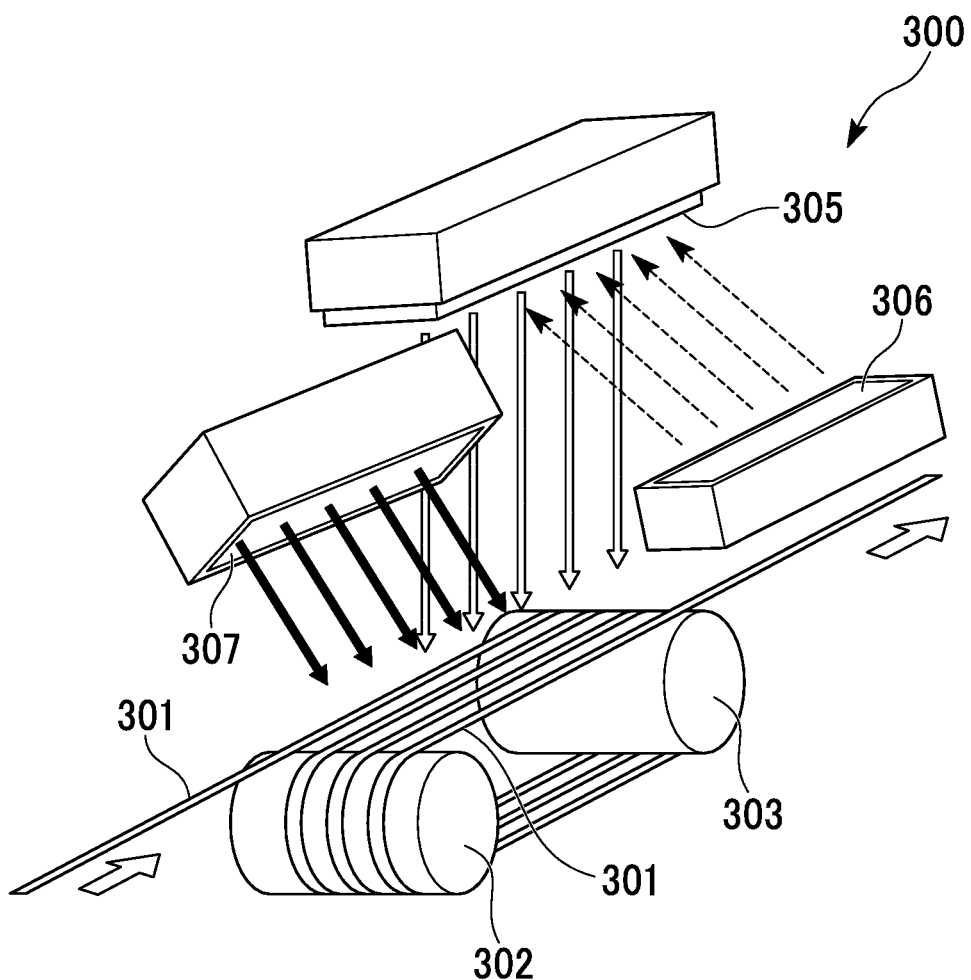
FIG. 9 is a schematic configuration diagram showing one example of an apparatus for forming an intermediate layer on a tape-shaped base material by the IBAD method.

The ion gun 16 is configured to introduce gas to be ionized into the inside of a cylindrical container and have an extraction electrode at the front, as shown in FIG. 6, for example. Then, it is a device in which some of atoms or molecules of the gas is ionized and the ionized particles are controlled by an electric field generated at the extraction electrode, thereby being radiated as an ion beam. As a method of ionizing gas, there are various methods such as a high-frequency excitation method and a filament method. The filament method is a method of performing ionization by energizing and heating a filament made of tungsten, thereby generating thermal electrons, and making the thermal electrons collide against the molecules of gas in a high vacuum. Further, the high-frequency excitation method is a method of performing ionization by polarizing the molecules of gas in a high vacuum by a high-frequency electric field.

In the present embodiment, for example, the ion gun 16 having a structure shown in FIG. 6 can be used. The ion gun 16 in the present example is configured to include an extraction electrode 28, a filament 29, and an introduction tube 20 for Ar gas or the like, which are provided in a tubular container 27, and can irradiate an irradiation area in a circular pattern with ions which are discharged in parallel in beam forms from a leading end of the container 27.

The four ion guns 16 are arranged in a row, thereby forming a size capable of irradiating an area having a width and a depth approximately equivalent to those in the rectangular ion source origin 14 of a structure in the related art with ion beams. For example, by arrangement of four ion guns, it is possible to dispose ion guns so as to be able to cover an area of about 90% or more in contradistinction to the rectangular ion source origin of a structure in the related art.

Among the four ion guns 16, all the ion guns which are disposed inside in an array direction are configured such that the outputs thereof can be individually adjusted.

Here, the output of the ion gun 16 means the product of an accelerating voltage which is applied to the extraction electrode 28 and the current value of the ion beam.

If the current value when generating the ion beam of each of the two ion guns 16 on both end sides is set to be in a range increased by 4 to 100% over the current value when generating the ion beam of each of the two ion guns 16 in the center, it is possible to uniformly sputter the sputter particles from the target 12 in a preferred state.

In a case where equal current values are applied to the four ion guns 16, due to a state of diffusion of the ion beams with which the ion guns 16 on the central side irradiate the target 12, the ion beams with which the ion guns 16 on the central side irradiate the target 12 are overlapped and irradiated, and as a result, the generation efficiency of sputter particles from the target 12 increases. On the other hand, in areas of the ion beams with which the ion guns 16 on both end sides irradiate both end sides of the target 12, overlap of the ion beams does not occur, so that sputtering efficiency decreases. As a result, there is a problem in that a film formation rate decreases, and it is not possible to generate even sputter particles. In contrast, if the current value when generating the ion beam of each of the two ion guns 16 on both end sides is set to be in a range increased by 4 to 100%, as described above, overlap of the diffused ion beams is small and a reduction in the amount of sputter particles at both ends can be prevented. For this reason, it is possible to efficiently and evenly generate the sputter particles from the target 12 in areas to which ions are irradiated by the ion guns 16 on both end sides. As a result, since it is possible to perform deposition of a desired amount of sputter particles in the film formation region 11 at a position corresponding to the end side of the target 12, uniform particles can be deposited in the film formation region 11 of a wide area corresponding to the rectangular target 12.

Figure 3:
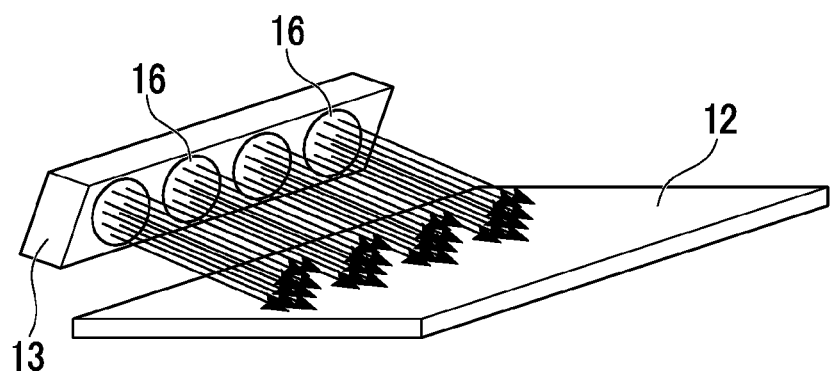
FIG. 3 is a schematic configuration diagram showing ion guns of the IBAD apparatus according to the embodiment.

Here, the case of forming a film by the IBAD method by operating the IBAD apparatus 10 having a configuration shown in FIG. 2 is described. The base material 2 shown in FIG. 1 is disposed in the film formation region 11. The four ion guns 16 are operated in this state, and sputtering is performed in which the sputter particles are sputtered by irradiating the target 12 with sputter beams, as shown in FIG. 3, with the current value when generating the ion beam of each of the two ion guns 16 on both end sides set to be in a range increased by 4 to 100% over the current value when generating the ion beam of each of the two ion guns 16 in the center, as described above. In this way, deposition of the sputter particles on the base material 2 disposed in the film formation region 11 is performed by making the sputter particles reach the film formation region 11 and also deposition of the previous sputter particles is performed while ion beams are irradiated from the assist ion source origin 15 at a given angle in a direction oblique to the base material 2 in the film formation region 11, as shown in FIG. 2.

By the above operation, the sputter particles generated from the target 12 can be formed into a film on the base material 2 with excellent crystalline orientation and uniform film thickness. As a result, a layer with excellent crystalline orientation can be deposited as the intermediate layer 3.

In addition, in the IBAD method, an arrival ratio of a sputter particle to an assist ion beam on the base material 2 is important and depending on this, the orientation of a film which can be obtained varies. Accordingly, in a large area, it needs to be close to the optimum ratio in the areas of all regions at film formation.

The case shown above is a case where the assist ion beams are uniformly irradiated and a case where the sputter particles also need to be uniformly supplied to the entirety of the film formation region. Of course, in a case where distribution of the assist ion beams due to a location arises for some reasons, according to the apparatus having the present structure, the ratio of the outputs of the sputter ion guns can be appropriately controlled depending on the intensity distribution of the assist ion beams. In this way, it is possible to make an arrival ratio of the sputter particle to the assist ion beam in a film formation area close to the optimum ratio. Accordingly, it is also important that the current values of the individual assist ion guns can be set individually.

Further, by performing sputtering with the current value when generating the ion beam of each of the two ion guns 16 on both end sides set to be in a range increased by 4 to 100% over the current value when generating the ion beam of each of the two ion guns 16 in the center, as described above, a film having a uniform thickness can be deposited on the surface side of the base material 2 disposed in the film formation region 11. Further, if the four round ion guns 16 which are used in the present embodiment are contrasted with the rectangular large-area ion gun 14, in the case of using the rectangular large-area ion gun 14 so as to correspond to the rectangular region of the target 12, the ion gun has to be manufactured specially. On the other hand, in the case of a round ion gun, it is possible to use a general-purpose ion gun which is used in a general film-formation field such as a semiconductor field. For this reason, an ion gun which is applied can be easily made to have a low-cost structure. Accordingly, in contradistinction to an IBAD apparatus having a structure in the related art, in which a rectangular ion gun is specially manufactured, there is an effect which leads to a reduction in cost of the entirety of the IBAD apparatus.

Further, by setting the current value when generating the ion beam of each of the two ion guns 16 on both end sides to be in a range increased by 4 to 100% over the current value when generating the ion beam of each of the two ion guns 16 in the center, as described above, it is possible to improve the orientation of a film which can be produced. Improvement in orientation is advantageous in terms of improvement in superconducting characteristic.

In addition, the intermediate layer 3 having a two-layer structure composed of the first layer 3A made of MgO and the second layer 3B made of $Gd_2Zr_2O_7$ can be formed on the base material 2. In this case, it is possible to perform film formation once by making the target 12 made of MgO in the IBAD apparatus shown in FIG. 2 and then form a $Gd_2Zr_2O_7$ layer on the first layer by another IBAD apparatus having a configuration equivalent to the configuration shown in FIG. 2. Alternatively, in the IBAD apparatus shown in FIG. 2, after the target made of MgO is replaced with another target for production of a $Gd_2Zr_2O_7$ layer, formation of the second layer 3B can be performed in the same way. Further, in the case of forming the cap layer 4 on the second layer 3B by the IBAD method, it is possible to constitute the cap layer 4 by the IBAD apparatus using four ion guns in the same way.

From the above-described explanation, in place of the large rectangular ion gun 14 having a width of, for example, about 1 m, it is possible to use the combination of a plurality of round ion guns 16 each having a size of about ¼ for irradiation of a target having an equivalent area. In this case, it is possible to reduce the cost of the apparatus. Further, by performing sputtering by the combination of the plurality of round ion guns 16 for the large rectangular ion gun 14, it is possible to secure a more powerful sputtering rate, so that it is possible to improve efficiency at the time of film formation. In addition, in the case of a round ion gun, it is advantageous since it is possible to focus the ion beams based on the shape of a grid and to increase the intensity of the beam.

EXAMPLE

A specific example of the invention will be described below. However, the invention is not limited only to this example.

Example 1

First, a $Gd_2Zr_2O_7$ film having a thickness of 250 nm was formed on a long tape-shaped hastelloy metal base material for 30 minutes by the IBAD apparatus having the configuration shown in FIG. 2. At the time of the film formation, as an ion gun, a device having a configuration in which four ion guns each having an irradiation aperture of 16 cm are arranged laterally in a row was used, and measurement of samples of four places in a longitudinal direction (an array direction of the ion guns) was performed. The accelerating voltage of the extraction electrode of each of these ion guns was set to be 1500 V. Among the four ion guns, the current value of each of the two ion guns on the central side was set to be 200 mA and the current value of each of the two ion guns on both end sides was set to be 300 mA.

In contrast, formation of an intermediate layer was performed by using an ion gun having a rectangular irradiation aperture having a width of 16 cm and a length of 1.1 m in place of the foregoing four ion guns, setting the accelerating voltage to be 1500 V, setting the current value to be 1000 mA, and setting other conditions to be the same.

For further comparison, formation of an intermediate layer was performed with the accelerating voltage set to be 1500 V, all the current values set to be 250 mA, and other conditions set to be the same in the foregoing four ion guns. With respect to each of the obtained films, measurement of film thicknesses at positions equivalent to those in the foregoing example was performed.

The above-described results are shown in Table 1 below.

TABLE 1

| | |
|---|---|
| Shape of ion gun: | rectangular ion gun (single) |
| Current value: | (uniformly) 1000 mA |
| Film thickness: | 313 nm-520 nm-517 nm-326 nm |
| Shape of ion gun: | circular ion gun (four) |
| Current value: | (equally) 250 mA × 4 |
| Film thickness: | 530 nm-710 nm-702 nm-552 nm |
| Shape of ion gun: | circular ion gun (four) |
| Current value: | two on the central side: 250 mA; two on both end sides: 300 mA |
| Film thickness: | 746 nm-753 nm-760 nm-738 nm |
| Shape of ion gun: | circular ion gun (four) |
| Current value: | two on the central side: 250 mA; two on both end sides: 280 mA |
| Film thickness: | 632 nm-718 nm-722 nm-625 nm |

As shown in Table 1, in a case where film formation was performed using the rectangular ion gun, variation in film thickness is large. Further, even in a case where film formation was performed using four circular ion guns, when the current values are equal, variation in film thickness is large. In contrast, in a case where film formation was performed using four circular ion guns with the current value of each of the two ion guns on both end sides increased by 20% or 12% by setting the current value of each of the two ion guns on the central side to be 250 mA and the current value of each of the two ion guns on both end sides to be 300 mA or 280 mA, it became evident that it was possible to obtain a more highly uniform film.

TABLE 2

| | |
|---|---|
| Shape of ion gun: | circular ion gun (four) |
| Current value: | two on the central side: 250 mA; two on both end sides: 600 mA (+140%) |
| Degree of orientation (ΔΦ): | 30.5°-15.3°-15.2°-22.3° |
| Shape of ion gun: | circular ion gun (four) |
| Current value: | two on the central side: 250 mA; two on both end sides: 500 mA (+100%) |
| Degree of orientation (ΔΦ): | 13.2°-13.3°-12.2°-13.4° |
| Shape of ion gun: | circular ion gun (four) |
| Current value: | two on the central side: 250 mA; two on both end sides: 280 mA (+12%) |
| Degree of orientation (ΔΦ): | 11.3°-10.1°-10.2°-11.0° |
| Shape of ion gun: | circular ion gun (four) |
| Current value: | two on the central side: 250 mA; two on both end sides: 260 mA (+4%) |
| Degree of orientation (ΔΦ): | 11.9°-10.9°-10.8°-12.2° |
| Shape of ion gun: | circular ion gun (four) |
| Current value: | two on the central side: 250 mA; two on both end sides: 250 mA |
| Degree of orientation (ΔΦ): | 13.5°-11.3°-11.2°-14.2° |
| Shape of ion gun: | circular ion gun (four) |
| Current value: | two on the central side: 250 mA; two on both end sides: 300 mA (+20%) |
| Degree of orientation (ΔΦ): | 13.3°-10.9°-11.8°-12.2° |

From the above-described results, it is found that increasing the numerical values of the ion guns on both end sides is advantageous in any of the indices of film thickness uniformity and crystalline orientation. Further, from the values of ΔΦ, which is the index of the degree of orientation, it is also found that an increase in current value in a range of 4 to 100% is preferable and an increase in current value in a range of 4 to 20% is more preferable.

What is claimed is:

1. An IBAD apparatus comprising:
   a target;
   a sputter ion source irradiating the target with sputter ions to sputter some of constituent particles of the target;
   a film formation region which has a rectangular shape and in which a base material which has a long tape shape for depositing thereon the particles sputtered from the target is disposed; and
   an assist ion beam irradiation device irradiating assist ion beams from a direction oblique to the direction of a normal of the film formation surface of the base material disposed in the film formation region, wherein:
   the sputter ion source comprises a plurality of ion guns arranged so as to be able to irradiate the target from an end portion on one side to an end portion on the other side with sputter ion beams;
   the base material travels in a longitudinal direction of the base material;
   the target is formed in a rectangular shape so as to correspond to the film formation region, and is disposed such that a long axis of the target corresponds to a travel direction of the base material;

the plurality of ion guns is disposed along a longitudinal direction of the long axis of the target and the film formation region;

the sputter ion source is disposed parallel to the target such that a distance between each of the plurality of ion guns and the target is constant; and the sputter ion beams from the plurality of ion guns irradiated to the target are parallel to each other.

2. The IBAD apparatus according to claim 1, wherein the current value of each of the ion guns disposed at both ends of the plurality of ion guns is set to be higher than the current value of each of the other ion guns disposed between the ion guns disposed at both ends.

3. The IBAD apparatus according to claim 1, wherein the current value of each of the ion guns disposed at both ends is set to be 4 to 100% higher than the current value of each of other ion guns disposed between the ion guns disposed at both ends.

4. The IBAD apparatus according to claim 1, wherein the current values of the plurality of ion guns are respectively adjusted.

5. An IBAD method for forming a film on a base material disposed in the film formation region by depositing the constituent particles of the target on the base material by using an IBAD apparatus comprising:

a target;

a sputter ion source comprising a plurality of ion guns arranged so as to be able to irradiate the target from an end portion on one side to an end portion on the other side with sputter ion beams which sputter some of constituent particles of the target;

a film formation region which has a rectangular shape and in which a base material which has a long tape shape for depositing thereon the particles sputtered from the target is disposed; and an assist ion beam irradiation device irradiating assist ion beams from a direction oblique to the direction of a normal of the film formation surface of the base material disposed in the film formation region, wherein:

the base material travels in a longitudinal direction of the base material; the target is formed in a rectangular shape so as to correspond to the film formation region, and is disposed such that a long axis of the target corresponds to a travel direction of the base material;

the plurality of ion guns is disposed along the longitudinal direction of the long axis of the target and the film formation region; and the sputter ion source is disposed parallel to the target such that a distance between each of the plurality of ion guns and the target is constant, the method comprising:

performing ion beam assisted deposition with the current value for generating the sputter ion beam of each of the ion guns disposed at both ends of the plurality of ion guns set to be higher than the current value for generating the sputter ion beam of each of other ion guns disposed between the ion guns disposed at both ends, and for irradiating the sputter ion beam from each of the other ion guns so as to overlap each other.

6. The IBAD method according to claim 5, wherein when performing ion beam assisted deposition, the current value of each of the ion guns disposed at both ends is set to be 4 to 100% higher than the current value of each of other ion guns disposed between the ion guns disposed at both ends.

7. A manufacturing method of an oxide superconductor comprising:

forming an intermediate layer on a base material using the IBAD method according to claim 5; and forming an oxide superconducting layer on the intermediate layer.

* * * * *